(12) United States Patent  
Hirakawa et al.

(10) Patent No.: US 7,034,392 B2  
(45) Date of Patent: Apr. 25, 2006

(54) DUPLEXER

(75) Inventors: Akio Hirakawa, Tokyo (JP); Yoshiaki Fujita, Tokyo (JP); Tomokazu Komazaki, Saitama (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 40 days.

(21) Appl. No.: 10/886,047

(22) Filed: Jul. 8, 2004  
(Under 37 CFR 1.47)

(65) Prior Publication Data  
US 2005/0104203 A1 May 19, 2005

(30) Foreign Application Priority Data  
Jul. 23, 2003 (JP) .............................. 2003-278359

(51) Int. Cl.  
*H01L 23/053* (2006.01)

(52) U.S. Cl. ........................................ 257/700; 257/691

(58) Field of Classification Search ................ 257/700, 257/691, 724  
See application file for complete search history.

(56) References Cited

U.S. PATENT DOCUMENTS 5,859,473 A    1/1999  Ikata et al.

FOREIGN PATENT DOCUMENTS

| JP | 10-126213 | 5/1998 |
|---|---|---|
| JP | 2002-124847 | 4/2002 |

*Primary Examiner*—Roy Potter  
(74) *Attorney, Agent, or Firm*—Nixon Peabody LLP; Donald R. Studebaker

(57) ABSTRACT

A filter chip lying on an upper surface of a top layer package substrate is connected to an upper surface ground electrode (235). The upper ground electrode (235) and a lower surface ground electrode (237) are connected to each other via through electrodes (261, 262, 263), ground wiring patterns (251, 252), first connecting lines (271 to 276), and second connecting lines (281, 282). The first connecting lines (271 to 276) are connected to the ground wiring patterns (251, 252), whereas the second connecting lines (281, 282) are not connected to the ground wiring patterns (251, 252), respectively. Owing to the provision of the connecting lines connected to the ground wiring patterns (251, 252) and the connecting lines unconnected to the ground wiring patterns (251, 252), the impedance between a multilayer package substrate and ground can be adjusted.

2 Claims, 9 Drawing Sheets

CONFIGURATION OF DUPLEXER (PART 1)

CONFIGURATION OF MOBILE COMMUNICATION TERMINAL

CONFIGURATION OF DUPLEXER (PART 1)

CONFIGURATION OF DUPLEXER (PART 2)

GROUND WIRING OF COMPARATIVE EXAMPLE

DUPLEXER

BACKGROUND OF THE INVENTION

1. Field of the Invention

The present invention relates to a duplexer wherein a surface acoustic wave filter chip is mounted on a multilayer package substrate. The present invention can be applied to, for example, an antenna RF (Radio Frequency) part employed in a mobile communication terminal such as a cellular telephone.

2. Description of the Related Art

There has heretofore been known a duplexer wherein a surface acoustic wave filter (e.g., a polarized surface acoustic wave filter) is mounted on a multilayer package substrate. Such a duplexer has been adopted in, for example, an RF part of a mobile communication terminal such as a cellular phone. In the mobile communication terminal, one antenna is employed in both transmission and reception. Therefore, a transmitting filter, a receiving filter, a branching line, etc. are mounted on one multilayer package substrate in the duplexer for the mobile communication terminal. The duplexer having the multilayer package substrate has been disclosed in the following Patent Documents 1 and 2, for example.

As shown even in FIG. 1 of the following Patent Document 1, the multilayer package substrate is made up of a plurality of package substrates in this type of duplexer. The top layer package substrate is provided on its upper surface with a chip of a surface acoustic wave filter. This chip is formed with, for example, a large number of comb-shaped filters. Wiring patterns are formed on the upper surfaces of the respective package substrates respectively. Further, the bottom layer package substrate is formed on its lower surface with signal electrodes, ground electrodes, etc. The surface acoustic wave filter chip is connected to top layer wiring patterns by, for example, wire bonding or the like. The wiring patterns of the respective layers and the electrodes (signal and ground electrodes) on the lower surface of the bottom layer are suitably connected to one another by through electrodes provided within the multilayer package substrate.

In addition, as shown in FIGS. 13 and 14 of the following Patent Document 2, there may be a case in which wiring patterns are provided on their corresponding side surfaces of the multilayer package substrate, and electrodes provided on an upper surface of a top layer package substrate and electrodes provided on a lower layer of a bottom layer package substrate are connected to one another.

The duplexers having such configurations are effective in bringing the mobile communication terminal into less size and weight.

Patent Document 1

Japanese Unexamined Patent Publication No. 2002-124847 (3rd and 4th pages and FIG. 1)

Patent Document 2

Japanese Unexamined Patent Publication No. Hei 10(1998)-126213 (3rd page and FIGS. 13 through 17)

As described above, one antenna is used in both transmission and reception in the mobile communication terminal or the like. Assuming that a transmit frequency band ranges from 824 MHz to 849 MHz and a receive frequency band ranges from 869 MHz to 894 MHz, a surface acoustic wave filter in which the range of 824 MHz to 849 MHz is defined as a pass band, and other frequencies are defined as an attenuation band, and a surface acoustic wave filter in which the range of 869 MHz to 894 MHz is defined as a pass band, and other frequencies are defined as an attenuation band, are formed on the above chip. This chip is mounted on its corresponding upper surface of the top layer package substrate.

As to the duplexing characteristics here, pass band characteristics in the pass band and attenuation characteristics in the attenuation band must meet predetermined specs. However, the surface acoustic wave filter changes in characteristic when it is formed as the unitary chip and after being mounted on the multilayer package. Thus, the characteristic of the singular chip must be determined in anticipation of this change in characteristic. As one factor of the change in characteristic, may be mentioned an influence of inductance of each of bonding wires for connecting the chip and wiring patterns. As other factors, may be considered, imperfection of a ground potential portion provided within the multilayer package, and coupling between the wiring patterns.

Therefore, the design conditions of the respective surface acoustic wave filters have heretofore been fixed up in consideration of the inductance of each bonding wire. However, such a method has encountered difficulties in obtaining high-performance characteristics as shown as design characteristics.

SUMMARY OF THE INVENTION

With the foregoing in view, it is therefore an object of the present invention to provide a duplexer which includes high-performance filter characteristics and is improved in production yield.

According to one aspect of the present invention, there is provided a duplexer, comprising:

a multilayer package substrate having a plurality of package substrates laminated on one another;

a surface acoustic wave filter chip disposed on an upper surface of the package substrate corresponding to a top layer;

an upper surface ground electrode formed on the upper surface of the package substrate corresponding to the top layer and connected to ground electrodes of the surface acoustic wave filter chip;

a lower surface ground electrode formed on a lower surface of the package substrate corresponding to a bottom layer;

ground wirings formed on at least one junction face of respective junction faces of the plurality of package substrates and connected to the upper surface ground electrode via through electrodes provided in the multilayer package substrate;

one or a plurality of first connecting lines provided on the side surfaces of the multilayer package substrate and connected to some or all of the ground wirings and the upper surface ground electrode and the lower surface ground electrode; and one or a plurality of second connecting lines which are provided on the side surfaces of the multilayer package substrate and which are connected to the upper surface ground electrode and the lower surface ground electrode and unconnected to the ground wirings.

According to such a configuration, variations in the impedance of each ground potential portion in the multilayer package substrate due to parasitic impedance or the like can be suppressed owing to the provision of the second connecting lines. It is thus possible to improve attenuation characteristics of the duplexer.

According to the present invention, since the second connecting lines are provided in addition to the through electrodes and the first connecting lines as means for connecting the upper surface ground electrode and the lower surface ground electrode, the attenuation characteristics of the duplexer can be improved.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 10 is a graph

DETAILED DESCRIPTION OF THE INVENTION

Figure 1:
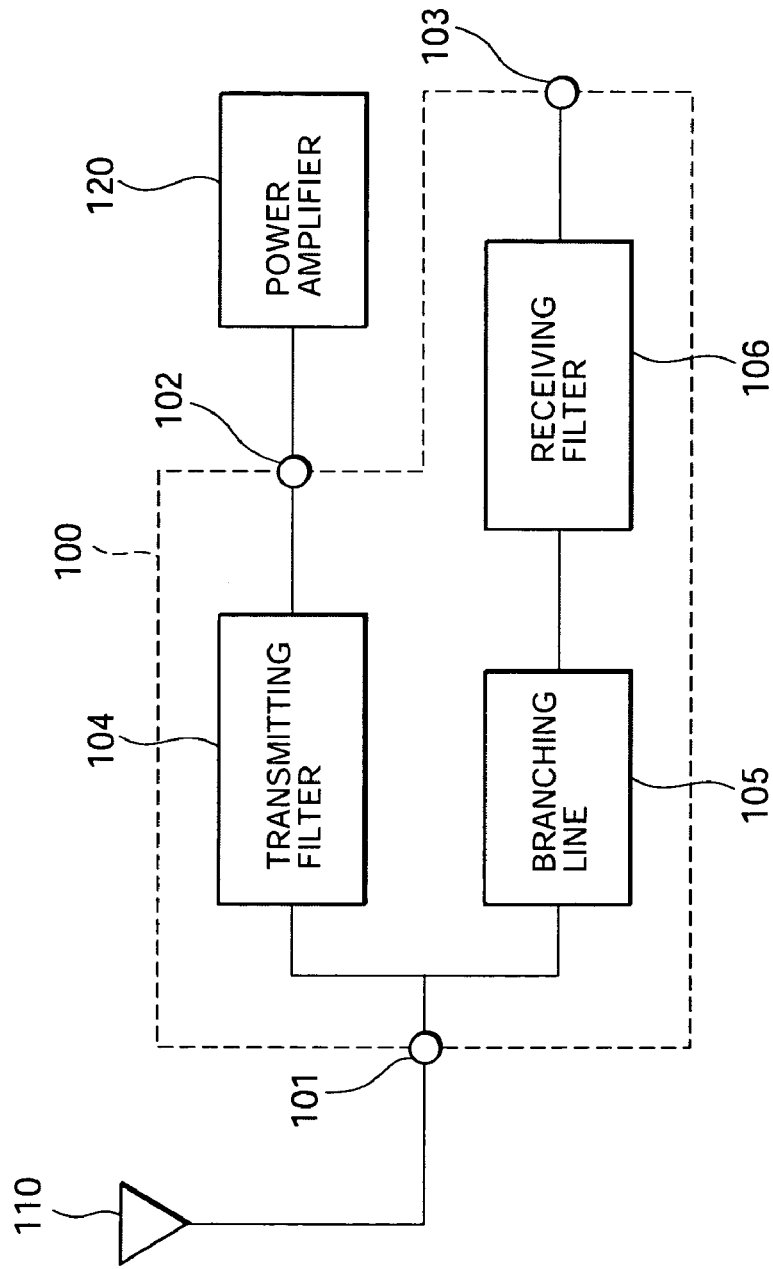
FIG. 1 is a block diagram showing a schematic configuration of a mobile communication terminal equipped with a duplexer according to an embodiment of the present invention.

A preferred embodiment of the present invention will hereinafter be described with reference to the accompanying drawings. In the drawings, the sizes, shapes and positional or layout relationships of respective components are simply roughly shown to such a degree that the present invention can be understood. Numerical conditions to be described below are nothing but a mere illustrative example.

FIG. 1 is a block diagram showing a schematic configuration of a mobile communication terminal equipped with a duplexer according to this embodiment of the present invention. As shown in FIG. 1, the mobile communication terminal is provided with a duplexer 100, an antenna 110 and a power amplifier 120. The duplexer 100 comprises an antenna terminal 101, a transmit signal input terminal 102, a receive signal output terminal 103, a transmitting filter 104, a branching line 105 and a receiving filter 106. Here, the transmitting filter 104 and the receiving filter 106 are formed in a surface acoustic wave filter chip to be described later. In FIG. 1, a transmit signal is amplified by the power amplifier 120, after which it passes through the transmitting filer 104, followed by being transmitted through the antenna 110. A receive signal is received by the antenna 110, after which it is inputted via the branching line 105 to the receiving filter 106, where attenuation band components are removed, followed by being transmitted to a processing circuit (not shown).

Figure 2:
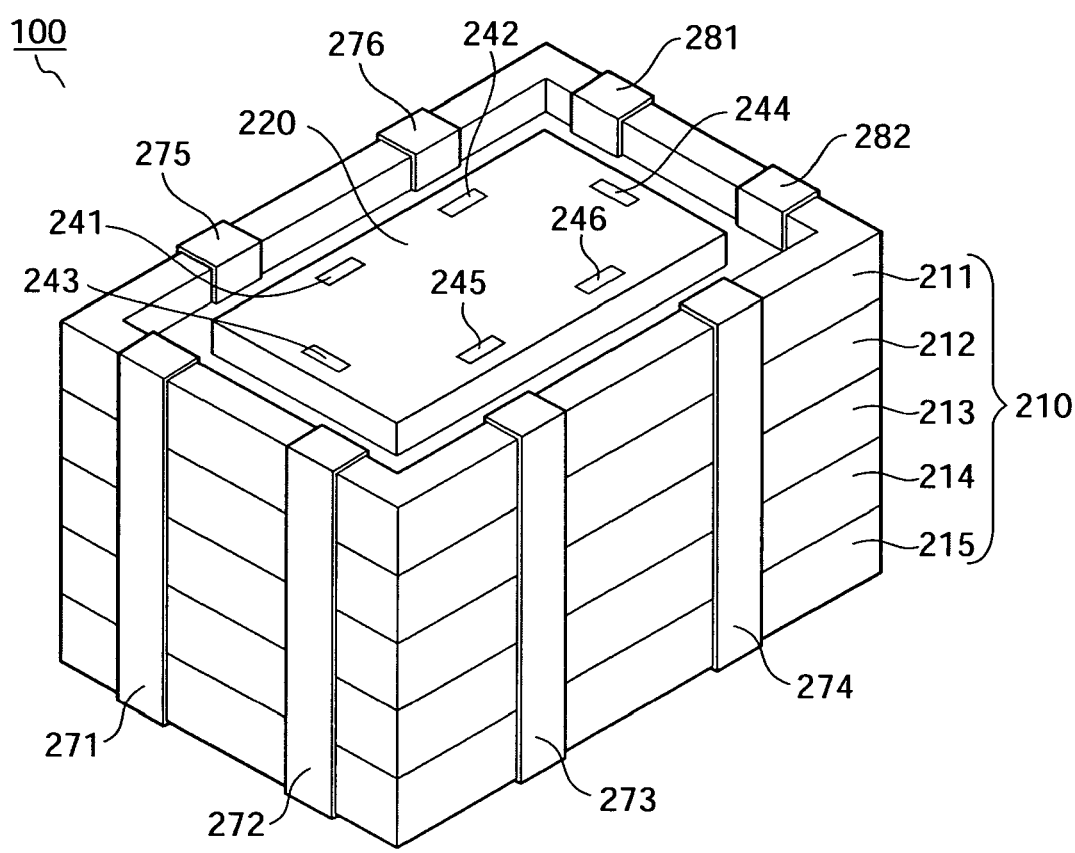
FIG. 2 is a perspective view schematically illustrating a structure of the duplexer according to the embodiment of the present invention.
Figure 3:
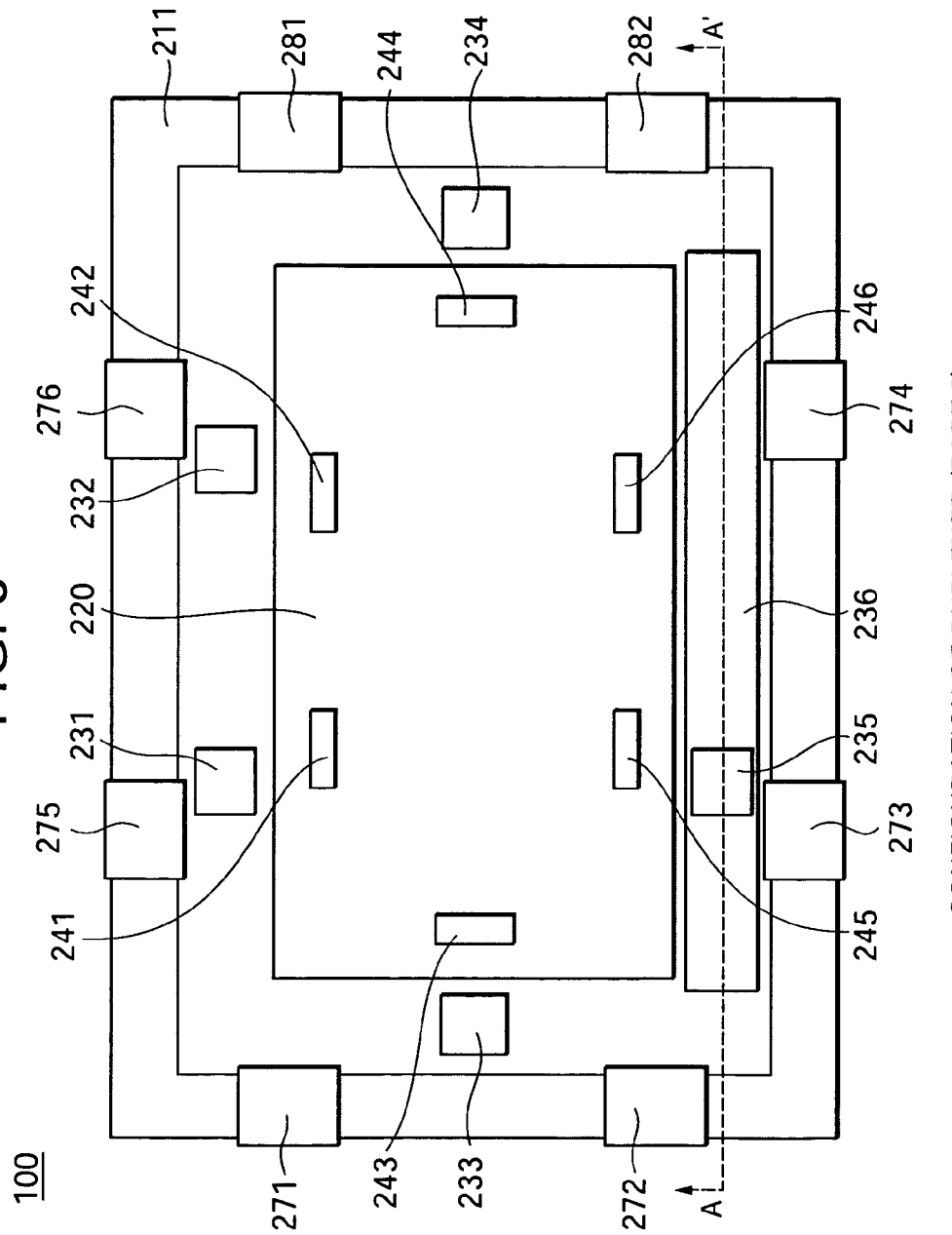
FIG. 3 is a plan view schematically depicting the structure of the duplexer according to the embodiment of the present invention.
Figure 4:
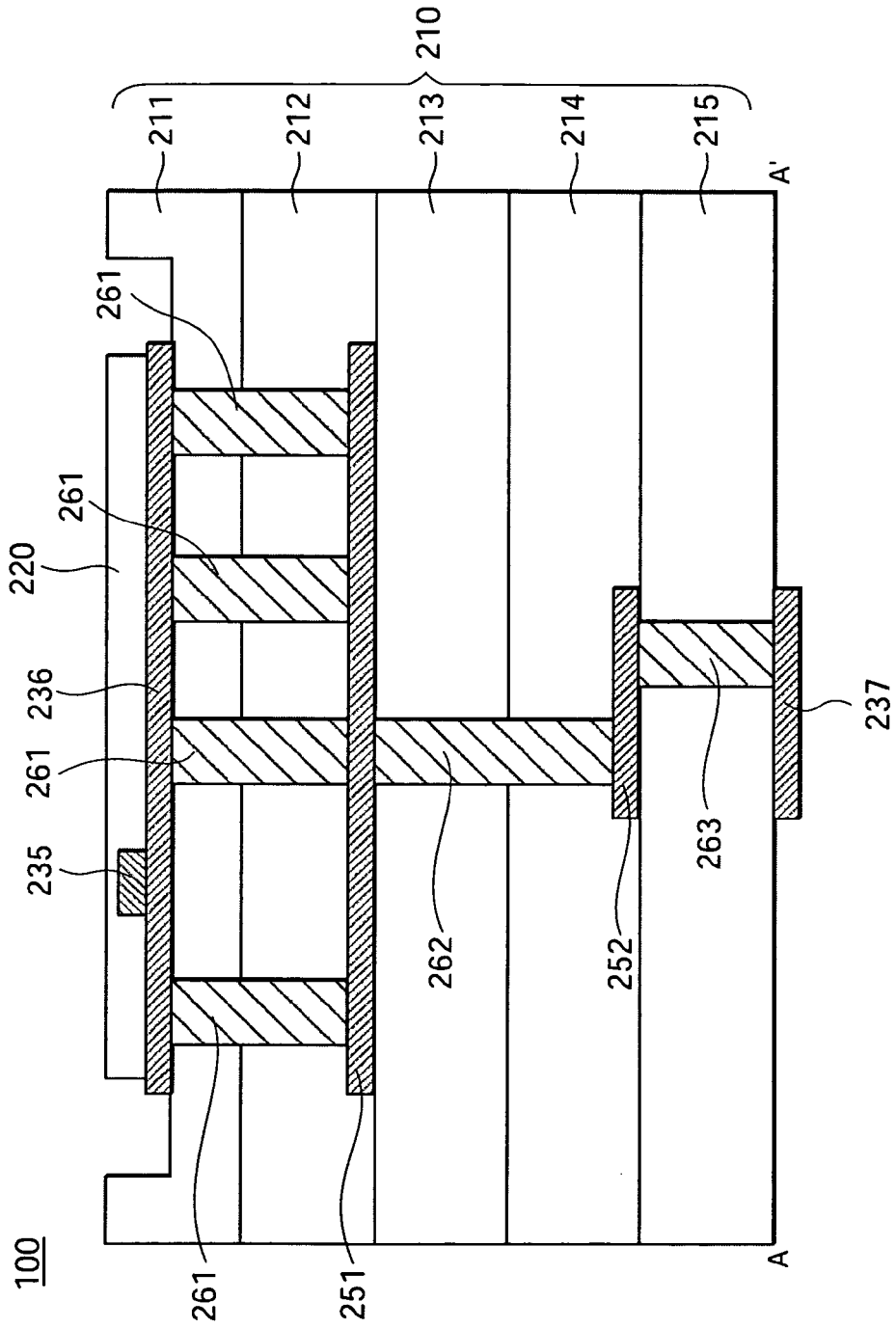
FIG. 4 is a cross-sectional view taken along line A–A' of FIG. 3.
Figure 5:
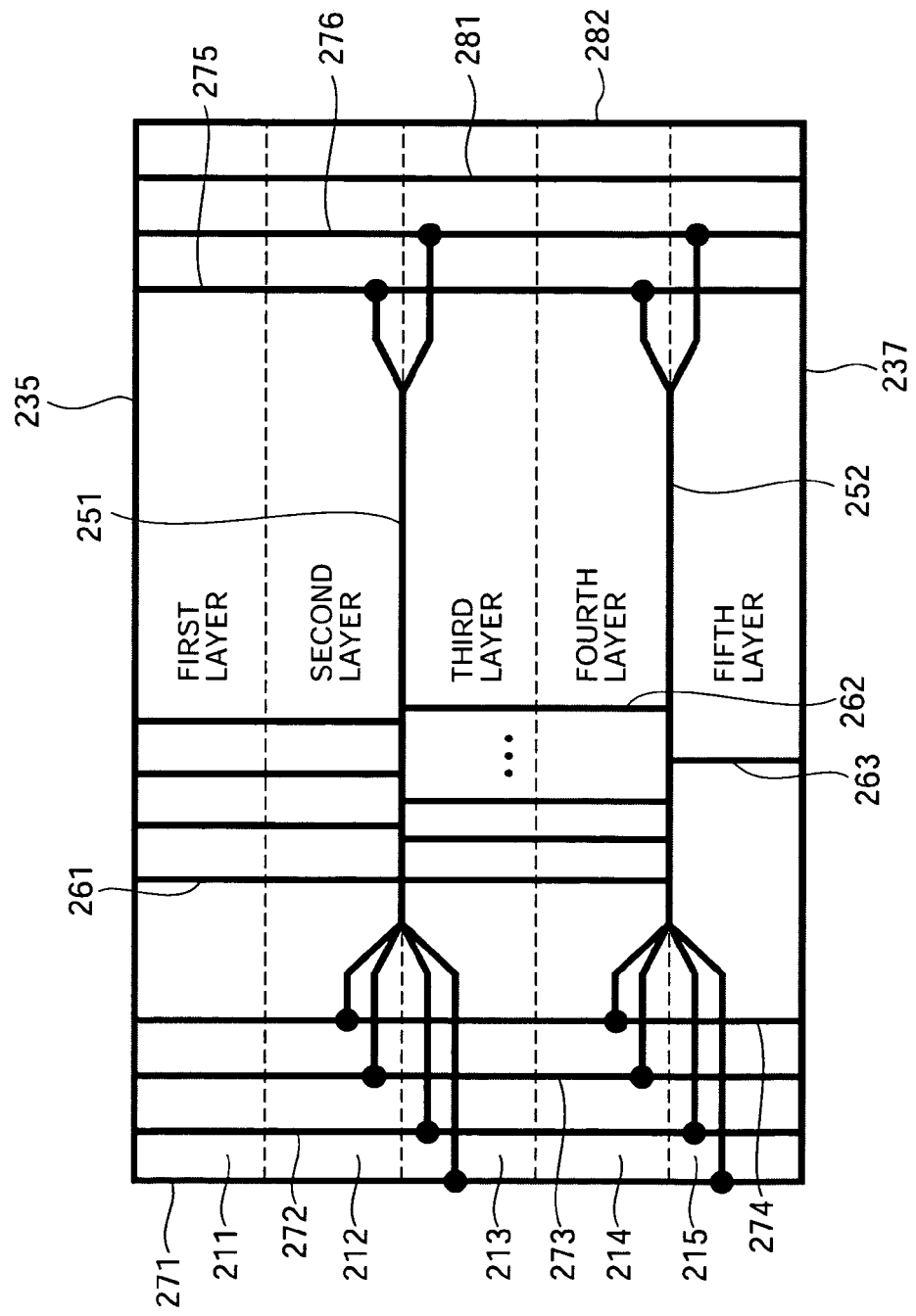
FIG. 5 is a conceptual diagram showing a ground wiring of the duplexer according to the embodiment of the present invention.

FIGS. 2 through 5 are diagrams schematically showing a structure of the duplexer 100 according to the present embodiment, wherein FIG. 2 is a perspective view, FIG. 3 is a plan view, and FIG. 4 is a cross-sectional view taken along line A–A' of FIG. 3, respectively. FIG. 5 is a conceptual diagram showing an essential part of the branching line 105.

As shown in FIGS. 2 through 5, the duplexer 100 of the present invention includes a multilayer package substrate 210 and a surface acoustic wave filter chip 220.

The multilayer package substrate 210 includes package substrates 211, 212, 213, 214 and 215 of five layers. The respective package substrates 211 through 215 are respectively formed of an insulative material such as ceramic.

A filter chip 220 is mounted on the top layer package substrate 211. The package substrate 211 is formed, on its upper surface, with upper surface antenna electrodes 231 and 232, an upper surface transmit signal electrode 233, an upper surface receive signal electrode 234, and an upper surface ground electrode 235. The upper surface ground electrode 235 is connected to through electrodes 261, 261, . . . to be described later via a wiring 236.

The bottom layer package substrate 215 is provided, on its lower surface, with a lower surface antenna electrode (corresponding to the antenna terminal 101 in FIG. 1), a lower surface transmit signal electrode (corresponding to the transmit signal input terminal 102 in FIG. 1), and a lower surface receive signal electrode (corresponding to the receive signal output terminal 103 in FIG. 1). Further, a lower surface ground electrode 237 is formed on the lower surface of the package substrate 215 (see FIG. 4).

Ground wiring patterns 251 and 252 are formed on a junction face between the package substrates 212 and 213 and a junction face between the package substrates 214 and 215 respectively. The ground wiring pattern 251 is connected to the upper surface ground electrode 235 via the four through electrodes 261, 261, . . . . Further, the ground wiring patterns 251 and 252 are interconnected with each other by sixteen through electrodes 262, 262, . . . . Also the ground wiring pattern 252 is connected to its corresponding lower surface ground electrode 237 via a through electrode 263. Incidentally, the upper surface antenna electrodes 231 and 232 and the lower surface antenna electrode, the upper surface transmit signal electrode 233 and the lower surface transmit signal electrode, and the upper surface receive signal electrode 234 and the lower surface receive signal electrode are respectively interconnected with one another through unillustrated wiring patterns and through electrodes.

Six first connecting lines 271, 272, 273, 274, 275 and 276, and two second connecting lines 281 and 282 are formed on their corresponding side surfaces of the multilayer package substrate 210. The first connecting lines 271 through 276 are connected to the upper surface ground electrode 235, the lower surface ground electrode 236 and the ground wiring patterns 251 and 252. On the other hand, the second connecting lines 281 and 282 are connected to the upper surface ground electrode 235 and the lower surface ground electrode 237 but not connected to the ground wiring patterns 251 and 252 (see FIG. 5).

The surface acoustic wave filter chip 220 includes a number of comb-shaped filters (not shown), antenna electrodes 241 and 242, a transmit signal input electrodes 243, a receive signal output electrode 244, and ground electrodes 245 and 246. The respective electrodes 241 through 246 are connected to their corresponding electrodes 231 through 235 by unillustrated bonding wires. Since the details of a circuit portion using the comb-shaped filters are similar to conventional ones, the details thereof are omitted.

The principle of the duplexer 100 according to the present embodiment will next be explained.

It is desirable that the ground potentials of the respective package substrates 211 through 215 are perfectly zero to obtain satisfactory attenuation characteristics of the surface acoustic wave filter. Therefore, the multilayer package substrate 210 is provided with ground through electrodes and connecting lines in large numbers. However, it is difficult to perfectly bring the potentials of the respective package substrates 211 through 215 to zero even in the case of such a configuration.

On the other hand, in the present embodiment, the impedance between each of the package substrates 211 through 215 and ground is set to the optimum value without causing such potentials to approximate perfect zero, thereby improving attenuation characteristics. To this end, the present embodiment is newly provided with the connecting lines which are connected to the second connecting lines 281 and 282, i.e., the upper surface ground electrode 235 and the lower surface ground electrode 237 but not connected to the ground wiring patterns 251 and 252.

The impedance between each of the package substrates 211 through 215 and ground will be explained below by comparison with a duplexer having no second connecting lines 281 and 282. Incidentally, the total number of connecting lines is set as four for simplification of explanation in the following description.

Figure 6:
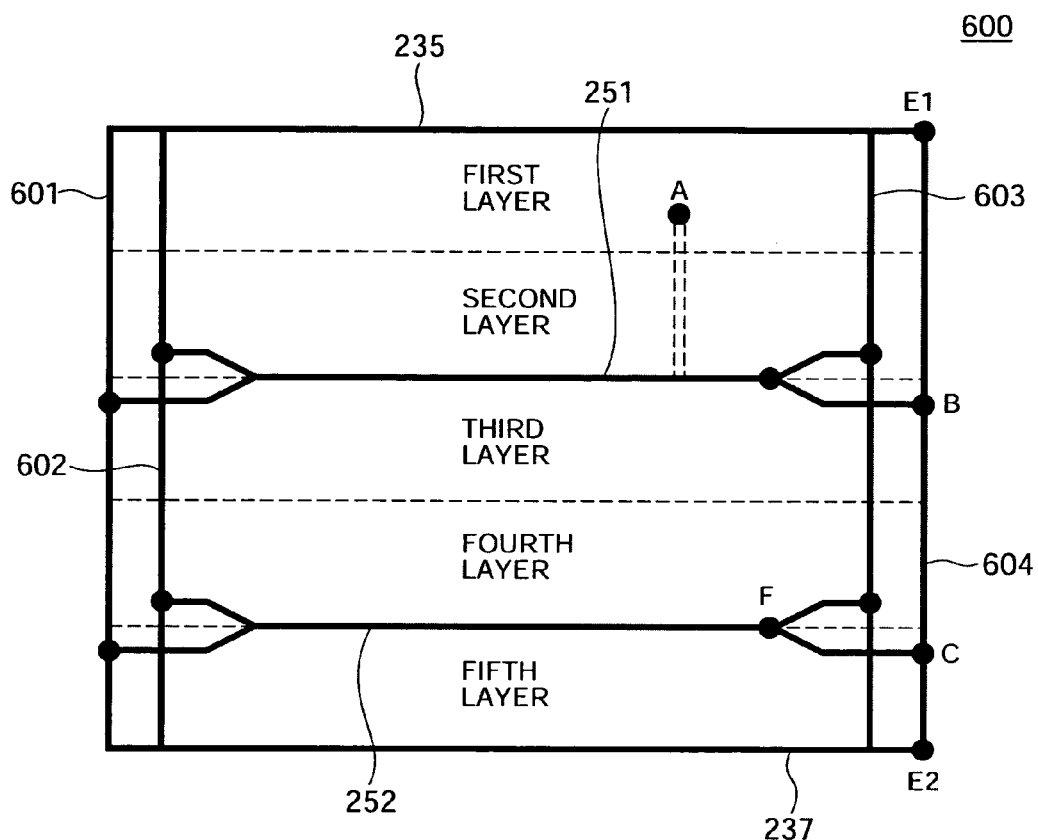
FIG. 6 is a conceptual diagram illustrating a ground wiring of a duplexer according to a comparative example.

FIG. 6 is a conceptual diagram showing a ground wiring example of a duplexer 600 having no second connecting lines (see reference numerals 281 and 282 in FIG. 5). In the present duplexer 600, all of the four connecting lines 601, 602, 603 and 604 are connected to their corresponding ground wiring patterns 251 and 252.

Figure 7:
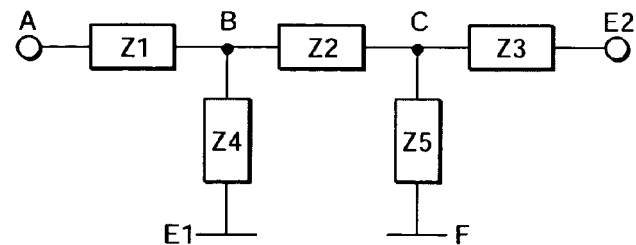
FIG. 7 is an equivalent circuit for describing the principle of operation of the duplexer according to the embodiment of the present invention.

FIG. 7 shows an equivalent circuit for describing the impedance of one connecting line. In FIG. 7, Z1 indicates impedance between an arbitrary point A in a multilayer package substrate 210 and an end B (end connected to the connecting lines 601 through 604) of the ground wiring pattern 251 (see FIG. 7). Z2 indicates impedance between the connecting point B and a connecting portion C on the connecting lines 601 through 604 side. Z3 indicates impedance between the connecting point C and a point E2 on a lower surface ground electrode 237. Z4 indicates impedance between the connecting point B and a point E1 on an upper surface ground electrode 235. Further, Z5 indicates impedance between the connecting point C and a connecting portion F on the ground wiring pattern 252 side. In FIG. 7, the impedances Z1, Z2, Z3, Z4 and Z5 can be considered to be approximately equal to impedances (impedance between a lower surface of a first layer and a lower surface of a third layer and impedance between the lower surface of the third layer and a lower surface of a fifth layer) of two layers. Thus, let's assume that $Z=Z1=Z2=Z3=Z4=Z5$ in the following description.

In such one first connecting line as shown in FIG. 7, an F matrix F0 and a Y matrix Y0 are respectively expressed in the following equations (1) and (2). Incidentally, for the F matrix and the Y matrix, see, for example, Hidetoshi Takahashi, "University's Practice Circuit" published by Shokabo Co., Ltd. (First edition, Dec. 10, 1962 (Showa 37)).

$$F0 = \begin{pmatrix} A & B \\ C & D \end{pmatrix} = \begin{pmatrix} 5 & 8Z \\ \frac{3}{Z} & 5 \end{pmatrix} \quad (1)$$

$$Y0 = \begin{pmatrix} Y11 & Y12 \\ Y21 & Y22 \end{pmatrix} = \frac{1}{8Z}\begin{pmatrix} 5 & 1 \\ 1 & 5 \end{pmatrix} \quad (2)$$

A composite impedance of the connecting lines 601, 602, 603 and 604 (see FIG. 6) will be discussed in parts where the four connecting lines are all connected to the ground wiring patterns 251 and 252, only the two connecting lines are connected to the ground wiring patterns 251 and 252 and only one connecting line is connected to the ground wiring patterns 251 and 252.

Figure 8A:
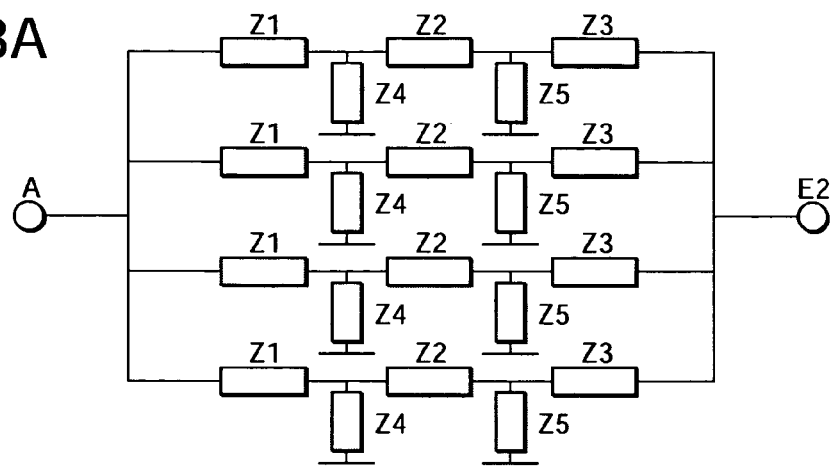
FIGS. 8A, 8B and 8C are equivalent circuits for describing the principle of operation of the duplexer according to the embodiment of the present invention.

(I) where the four connecting lines are all connected to the ground wiring patterns 251 and 252:

An equivalent circuit obtained in this case is shown in FIG. 8(A). As is understood from FIG. 8(A), four circuits identical in configuration to one another are connected in parallel in this case. Thus, an F matrix F40 and a Y matrix Y40 in this case are expressed in the following equations (3) and (4):

$$F40 = \begin{pmatrix} A & B \\ C & D \end{pmatrix} = \begin{pmatrix} 5 & 2Z \\ \frac{12}{Z} & 5 \end{pmatrix} \quad (3)$$

$$Y40 = \begin{pmatrix} Y11 & Y12 \\ Y21 & Y22 \end{pmatrix} = \frac{1}{2Z}\begin{pmatrix} 5 & 1 \\ 1 & 5 \end{pmatrix} \quad (4)$$

An impedance Z40 between A and E2 in this case is given by the following equation (5):

$$Z40 = Z\frac{5+2Z}{12+5Z} \quad (5)$$

As described above, Z indicates the impedance corresponding to the two layers of the package substrates. As is well known, the impedance can be expressed in $Z=j\omega L$ (where j: imaginary unit, $\omega$: angular frequency and L: inductance). The result of calculation of impedance obtained when the inductance is set as L=0.2 [nH], is expressed in (I) in the form of a graph of FIG. 9.

Figure 8B:
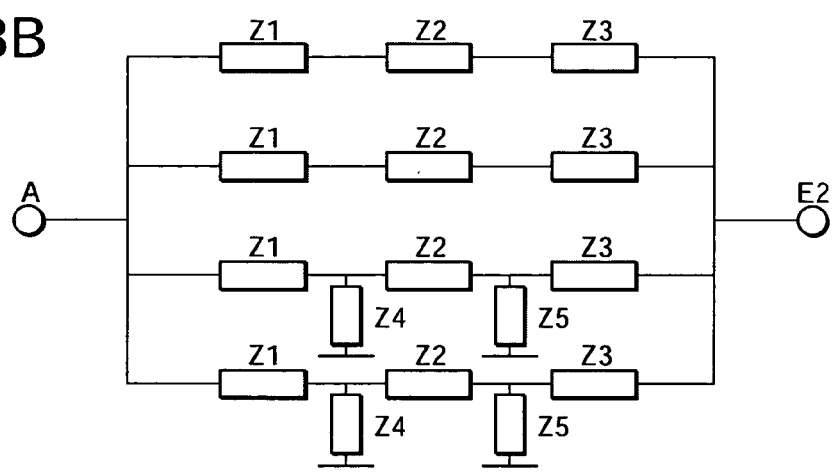

(II) where only the two connecting lines are connected to the ground wiring patterns 251 and 252:

An equivalent circuit in this case is shown in FIG. 8(B). As is understood from FIG. 8(B), two connecting lines similar to those shown in FIG. 7 and two connecting lines obtained by removing the impedances Z4 and Z5 from the circuit shown in FIG. 7 are connected in parallel. At this time, an F matrix F22 is expressed in the following equation (6):

$$F22 = \begin{pmatrix} A & B \\ C & D \end{pmatrix} = -\begin{pmatrix} \frac{23}{5} & \frac{12}{5Z} \\ \frac{9.23}{Z} & \frac{23}{5} \end{pmatrix} \quad (6)$$

An impedance Z22 between A and E2 is given by the following equation (7):

$$Z22 = -\frac{Z}{5} \cdot \frac{23 + 12Z}{9.23 + 23Z} \qquad (7)$$

Figure 9:
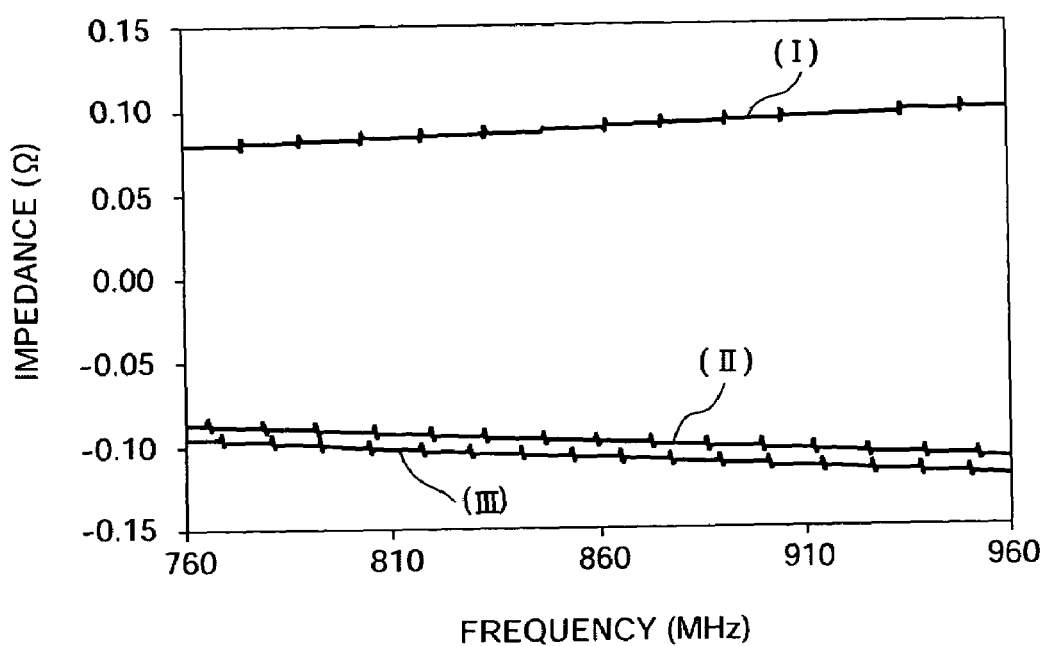
FIG. 9 is a graph for describing the characteristics of the duplexer according to the embodiment of the present invention.

The result of calculation of the impedance at the time that the inductance is set as L=0.2 [nH], is shown in FIG. 9 in the form of (II). As is understood from FIG. 9, the impedance in this case is different from the above case (I) in that the sign thereof is negative.

Figure 8C:
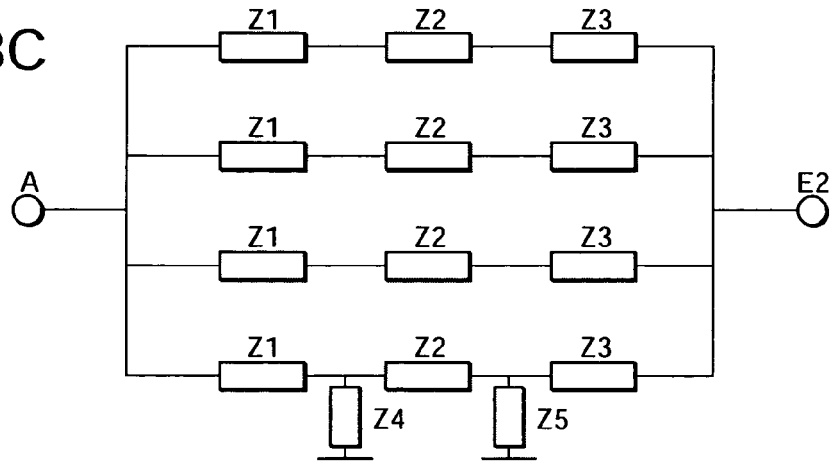

(III) where only one connecting line is connected to the ground wiring patterns 251 and 252:

An equivalent circuit in this case is shown in FIG. 8(C). As is understood from FIG. 8(C), one connecting line similar to FIG. 7 and three connecting lines obtained by removing the impedances Z4 and Z5 from the circuit shown in FIG. 7 are connected in parallel. An impedance Z13 between A and E2 in this case is given by the following equation (8):

$$Z13 = -Z\frac{53 - 24Z}{-117 + 53Z} \qquad (8)$$

The result of calculation of the impedance obtained when the inductance is represented as L=0.2 [nH], is expressed in (III) in the form of a graph of FIG. 9. The impedance in this case is different from the above case (I) in that an imaginary part is inverted.

Owing to the provision of both the connecting lines (first connecting lines) connected to the ground wiring patterns 251 and 252 and the connecting lines (second connecting lines) connected to the ground wiring patterns 251 and 252 as described above, the ground potential of the multilayer package substrate 210 can be adjusted. Thus, it is possible to improve attenuation characteristics of the duplexer 100.

Figure 10A:
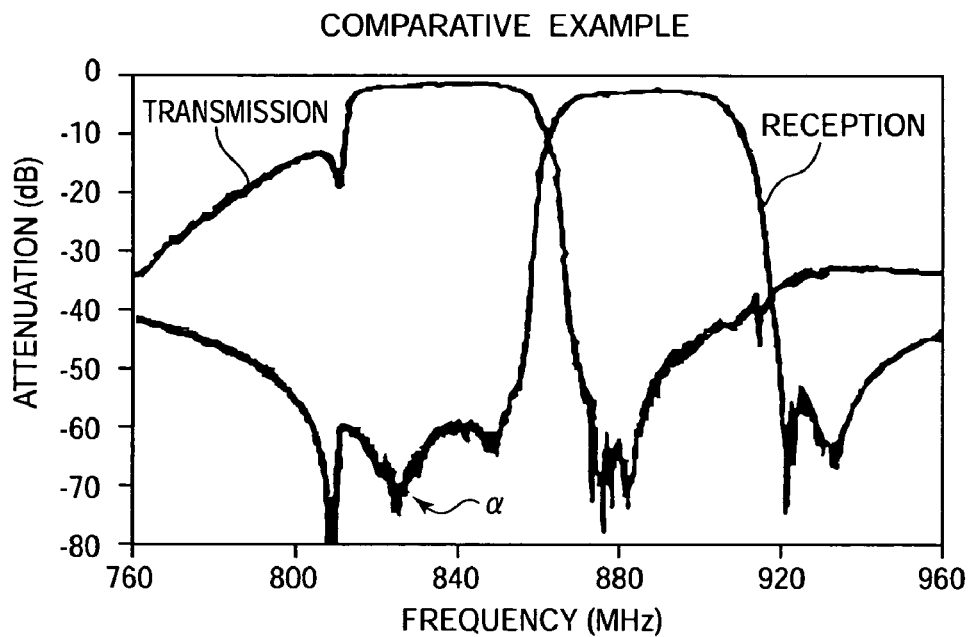
FIGS. 10A and 10B are graphs for describing the characteristics of the duplexer according to the embodiment of the present invention.
Figure 10B:
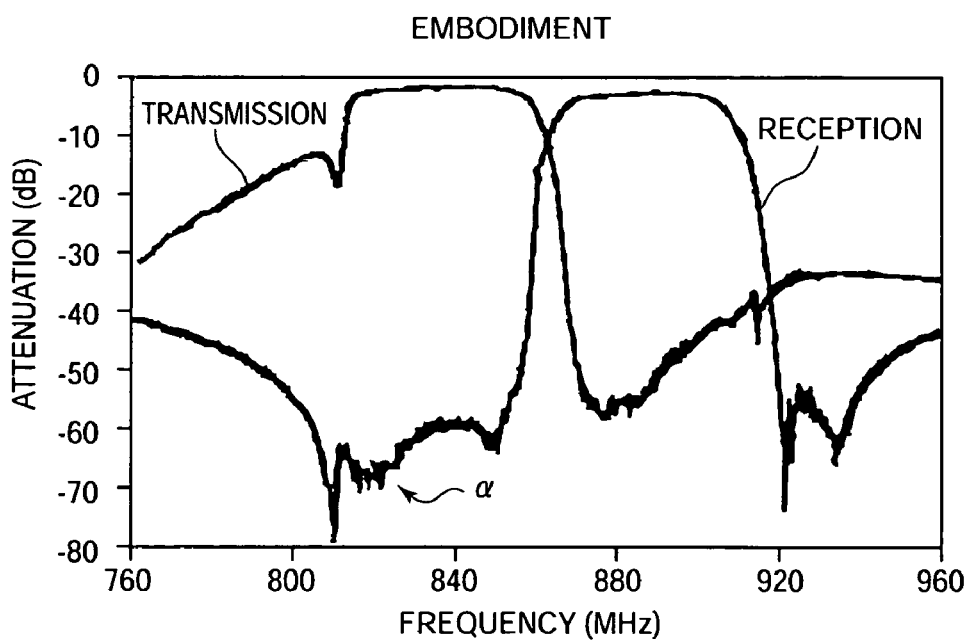

FIGS. 10(A) and 10(B) are respectively graphs showing characteristics of a duplexer used in a CDMA (Code Division Multiple Access) cellular phone terminal (transmit frequency band: 824 MHz to 849 MHz and receive frequency band: 869 MHz to 894 MHz). In FIGS. 10(A) and 10(B), the vertical axes indicate attenuation [dB], and the horizontal axes indicate frequencies, respectively. FIG. 10(A) shows the characteristics of the duplexer (using only four first connecting lines) according to the comparative example, and FIG. 10(B) shows the characteristics of the duplexer (in which the number of first connecting lines is two and the number of second connecting lines is two) according to the present embodiment.

An attenuation pole frequency (minimal value of attenuation band: see code α in FIG. 10(A)) of the receiving filter 106 (see FIG. 1) is located within a pass band (ranging from 824 MHz to 849 MHz) of the transmitting filter 104. On the other hand, in the duplexer according to the present embodiment, the attenuation pole frequency a is located on the outer side of the pass band of the transmitting filter 104. The attenuation pole frequency α of a receive frequency may preferably be located outside a transmit frequency pass band because satisfactory and stable transmit characteristics can be obtained.

The present inventors have prototyped duplexers where the total number of connecting lines is four and the three thereof are second connecting lines, where the two thereof are second connecting lines, where one of them is a second connecting line and where no second connecting line is provided (comparative example). As a result, when the three thereof correspond to the second connecting lines, the attenuation pole frequency was 816 MHz, when the two thereof correspond to the second connecting lines, the attenuation pole frequency was 819 MHz, when one of them corresponds to the second connecting line, the attenuation pole frequency was 822 MHz, and when no second connecting line is provided (comparative example), the attenuation pole frequency was 825 MHz. Thus, it is understood that when the second connecting lines are provided one or more, the attenuation pole frequency of the receive frequency is placed outside the transmit frequency pass band, whereas when no second connecting line is provided (comparative example), the attenuation pole frequency is located inside the transmit frequency pass band.

While the present invention has been described with reference to the illustrative embodiment, this description is not intended to be construed in a limiting sense. Various modifications of the illustrative embodiment will be apparent to those skilled in the art on reference to this description. It is therefore contemplated that the appended claims will cover any such modifications or embodiments as fall within the true scope of the invention.

What is claimed is:

1. A duplexer, comprising:
   a multilayer package substrate having a plurality of package substrates laminated on one another;
   a surface acoustic wave filter chip disposed on an upper surface of the package substrate corresponding to a top layer;
   an upper surface ground electrode formed on the upper surface of the package substrate corresponding to the top layer and connected to ground electrodes of the surface acoustic wave filter chip;
   a lower surface ground electrode formed on a lower surface of the package substrate corresponding to a bottom layer;
   ground wirings formed on at least one junction face of respective junction faces of the plurality of package substrates and connected to the upper surface ground electrode and the lower surface ground electrode via through electrodes provided in the multilayer package substrate;
   one or a plurality of first connecting lines provided on the side surfaces of the multilayer package substrate and connected to some or all of the ground wirings and the upper surface ground electrode and the lower surface ground electrode; and
   one or a plurality of second connecting lines provided on the side surfaces of the multilayer package substrate, said one or plural second connecting lines being connected to the upper surface ground electrode and the lower surface ground electrode and unconnected to the ground wirings.

2. A duplexer according to claim 1, wherein the first connecting lines are connected to all the ground wirings.

* * * * *